United States Patent
Kinkade et al.

(10) Patent No.: US 7,221,205 B2
(45) Date of Patent: May 22, 2007

(54) CIRCUIT AND METHOD FOR STORING DATA IN OPERATIONAL, DIAGNOSTIC AND SLEEP MODES

(75) Inventors: Martin Jay Kinkade, Austin, TX (US); Marlin Frederick, Cedar Park, TX (US)

(73) Assignee: Arm Limited, Cambridge (GB)

( * ) Notice: Subject to any disclaimer, the term of this patent is extended or adjusted under 35 U.S.C. 154(b) by 131 days.

(21) Appl. No.: 10/883,965

(22) Filed: Jul. 6, 2004

(65) Prior Publication Data

US 2006/0006900 A1 Jan. 12, 2006

(51) Int. Cl.
*H03K 3/289* (2006.01)
(52) U.S. Cl. .................... 327/203; 327/213
(58) Field of Classification Search ............... 327/213, 327/202, 203
See application file for complete search history.

(56) References Cited

U.S. PATENT DOCUMENTS

| | | | | |
|---|---|---|---|---|
| 4,782,283 A * | 11/1988 | Zasio | ................ | 714/726 |
| 5,130,568 A | 7/1992 | Miller et al. | ............. | 307/272.2 |
| 5,257,223 A | 10/1993 | Dervisoglu | ................ | 365/154 |
| 5,313,623 A | 5/1994 | Chinnaswamy et al. | .... | 395/575 |
| 5,689,517 A | 11/1997 | Ruparel | ................ | 371/22.3 |
| 5,986,945 A | 11/1999 | Zheng | ................ | 365/189.05 |
| 6,181,179 B1 | 1/2001 | Kanba | ................ | 327/202 |
| 6,239,640 B1 * | 5/2001 | Liao et al. | ................ | 327/218 |
| 6,437,623 B1 * | 8/2002 | Hsu et al. | ................ | 327/202 |
| 6,873,197 B2 * | 3/2005 | Kanba | ................ | 327/202 |
| 2004/0032290 A1 * | 2/2004 | Lundberg | ................ | 327/202 |
| 2004/0075479 A1 * | 4/2004 | Gupta | ................ | 327/202 |

OTHER PUBLICATIONS

U.S. Appl. No. 10/860,643, filed Jun. 4, 2004, Martin Kinkade et al.

* cited by examiner

*Primary Examiner*—Long Nguyen
*Assistant Examiner*—Ryan C Jager
(74) *Attorney, Agent, or Firm*—Nixon & Vanderhye P.C.

(57) ABSTRACT

A clocked scan flip-flop 2 is provided in which a latch 14 within the diagnostic data path is reused to store an operational signal value during a sleep mode. The operational signal value is supplied to the latch 14 via a sleep mode path 20 through a transmission gate 22 (or other tristate driver) controlled by a sleep mode control signal SLP. The diagnostic clock signal SCLK, the operational clock signal CLK and the sleep mode control signal SLP together provide the control operations for controlling the various elements within the clocked-scan flip-flop 2 to move into and out of sleep mode.

26 Claims, 8 Drawing Sheets

CIRCUIT AND METHOD FOR STORING DATA IN OPERATIONAL, DIAGNOSTIC AND SLEEP MODES

BACKGROUND OF THE INVENTION

1. Field of the Invention

This invention relates to the field of data processing systems. More particularly, this invention relates to circuits and methods of operating circuits which allow for the storage of a signal value in operational, diagnostic and sleep modes.

2. Description of the Prior Art

It is known to provide a variety of different types of circuits for storing signal values. One common type of such circuits is the master slave latch arrangement. Another type of such circuit utilises cross-coupled sense amplifiers and is termed a sense amplifier flip-flop. Another known type of storage circuit is termed a hybrid latch flip-flop. It is also known to provide diagnostic capabilities in association with both these types of flip-flop by adding a scan cell capability whereby a signal value may be captured and then serially scanned out of the circuit for diagnostic purposes.

A further type of storage circuit is a clocked-scan flip-flop. A clocked-scan flip-flop provides diagnostic capabilities and has a number of advantages over the other types of flip flop which also provide diagnostic capabilities. In particular, a clocked scan flip-flop only requires two clock signals to provide its operational and diagnostic capabilities whereas the LSSD flip-flops require three clock signals. This additional clock signal overhead increases the circuit area consumed as well as having other disadvantages. Mux-D type flip-flops require only one clock signal but have the disadvantage of introducing a multiplexer delay into the processing path. Furthermore, clocked scan flip flops are more suited to high speed operation and generally provide lower power consumption than the Mux-D flip-flop designs.

In addition to providing operational and diagnostic modes it is known to also provide a data retention mode, also sometimes called a sleep mode. Such a mode of operation allows the stored signal values to be securely held in a small portion of the circuitry whilst the remainder of the circuitry is powered down for leakage reduction purposes. When power is resumed, the saved signal value is restored and operation continues. One approach to supporting data retention in this way is to add balloon latches to the flip-flops such that signal values can be transferred into the balloon latches which have their own power supply, and then the power supply removed from the remainder of the flip-flops. A disadvantage of this approach is that the balloon latches consume considerable additional circuit area.

It has been proposed for sense amplifier flip-flops and hybrid latch flip-flops which have associated scan cells operating in accordance with the level sensitive scan design methodology to reuse the scan cells for data retention during a power down mode of operation. Whilst this approach reduces the increase in circuit overhead associated with providing the data retention capability, it does require for control the three clock signals of the sense amplifier flip-flops or hybrid latch flip-flops with their known disadvantages in terms of speed, power consumption and other factors.

SUMMARY OF THE INVENTION

Viewed from one aspect the present invention provides a circuit for storing a signal value, said circuit comprising:

an operational clock signal source operable in an operational mode to provide an operational clock signal;

an operational data path operable to store an operational signal value and including:
  an operational data path master latch clocked by said operational clock signal; and
  an operational data path slave latch clocked by said operational clock signal;

a diagnostic clock signal source operable in a diagnostic mode to provide a diagnostic clock signal;

a diagnostic data path operable to store a diagnostic signal value and including:
  a diagnostic data path master latch clocked by said diagnostic clock signal; and
  a diagnostic data path slave latch clocked by said diagnostic clock signal;

a sleep mode control signal source operable to provide a sleep mode control signal;

a sleep mode path selectively opened under control of said sleep mode control signal to allow transfer of said operational signal value between one of said operational data path master latch or said operational data path slave latch and one of said diagnostic data path master latch or said diagnostic data path slave latch, whereby said diagnostic data path serves to store said operational signal whilst said operational path is powered down during said sleep mode.

The invention recognises that in the context of a clocked-scan latch which includes diagnostic path latches scanned by a diagnostic clock and operational path latches scanned by an operational clock, data retention capability can be provided by using one of the latches from the diagnostic path whilst not requiring an increase in the number of clock signals but instead using a sleep mode path which can be selectively connected under control of a sleep mode control signal. Surprisingly the diagnostic clock signal and operational clock signal can be reused in the context of such circuits to perform the necessary control and switching operations to enter and leave the sleep mode without requiring an additional clock signal to be provided and routed to the various circuit elements. It will be appreciated that the term latch can be considered to encompasses a wide variety of storage elements including flip-flops, registers and the like.

Whilst in general terms the present technique is usable in systems having four separate latches (with circuit area, multiplexer delay and other penalties), it is strongly preferred that one of the latches in each of the operational data path and diagnostic data path is a shared latch. Thus, rather than having to provide two separate latches in each path, three latches can be used in total thereby advantageously reducing the circuit gate count.

In the context of embodiments utilising such a shared latch, it is desirable that the operational signal is held during sleep mode in the non-shared latch which makes up the diagnostic data path. As the shared latch forms part of the operational data path, its gates, power supply and configuration are as a priority designed to improve operational mode performance rather than provide the low power consumption which is desirable in sleep mode. Thus, using the other of the diagnostic data path latches for holding the operational signal value during sleep mode allows this latch to be designed with low power consumption in mind whilst not impacting the performance of the operational mode.

It will be understood that an operational data path will include a primary path which is the fastest signal path through the operational data path and this may be a performance constraining parameter of the system. In preferred embodiments of the invention, the sleep mode path connects to a point in the operational path which is decoupled from the primary path. It is desirable to reduce the loading on the primary path and accordingly decoupling the sleep mode path therefrom, and taking the operational signal value to be stored from other than a point on the primary path helps to maintain primary path performance. Connecting the sleep mode path to the primary path would also be possible, although not preferred.

It will be appreciated that when a shared latch is used this may appear within the diagnostic data path either before or after the other latch which forms the diagnostic data path. The same is also true for the operational data path. Whilst all these configurations are possible, preferred embodiments provide the shared latch to follow the other latch in both the diagnostic data path and the operational data path as this eases clocking and other requirements which are associated with the diagnostic mode of operation.

A particularly preferred way of embodying the shared latch is in the form of two tristate inverters which are selectively enabled by a respective one of the operational clock signal and the diagnostic clock signal. In this way the two tristate inverters can be made to function as a latch in either data paths by the combined operation of the two clock signals.

The switching of the sleep mode path can be achieved in a variety of different ways, but a particularly efficient way is to use a transmission gate switched by the sleep mode control signal.

Whilst a variety of different control schemes utilising the two clock signals and the sleep mode control signal are possible, preferred embodiments of the present technique utilise the sleep mode control signal to trigger transfer of the operational signal into the diagnostic data path and the diagnostic clock signal to control latching of the operational signal within the diagnostic data path.

The powering up of the operational data path after the sleep mode with appropriate other control signals in place can also effectively be used as another control signal to trigger the return of the operational value back into the operational data path.

In order to ensure that other circuits for storing a signal value which for diagnostic purposes are coupled to each other do not interfere with each other in sleep mode operation, preferred embodiments provide a diagnostic path isolating circuit at the input to the diagnostic data path and control this using the sleep mode control signal to isolate respective diagnostic data paths from one another.

Viewed from another aspect the present invention provides a method of storing a signal value, said method comprising the steps of:

in an operational mode providing an operational clock signal;

storing an operational signal value within an operational data path master latch and an operational data path slave latch clocked by said operational clock signal;

in a diagnostic mode providing a diagnostic clock signal;

storing a diagnostic signal value within a diagnostic data path master latch or a diagnostic data path slave latch clocked by said diagnostic clock signal;

providing a sleep mode control signal; and selectively opening a sleep mode path under control of said sleep mode control signal to allow transfer of said operational signal value between one of said operational data path master latch or said operational data path slave latch and one of said diagnostic data path master latch or said diagnostic data path slave latch, whereby said diagnostic data path serves to store said operational signal whilst said operational path master latch and said operational path slave latch are powered down during said sleep mode.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
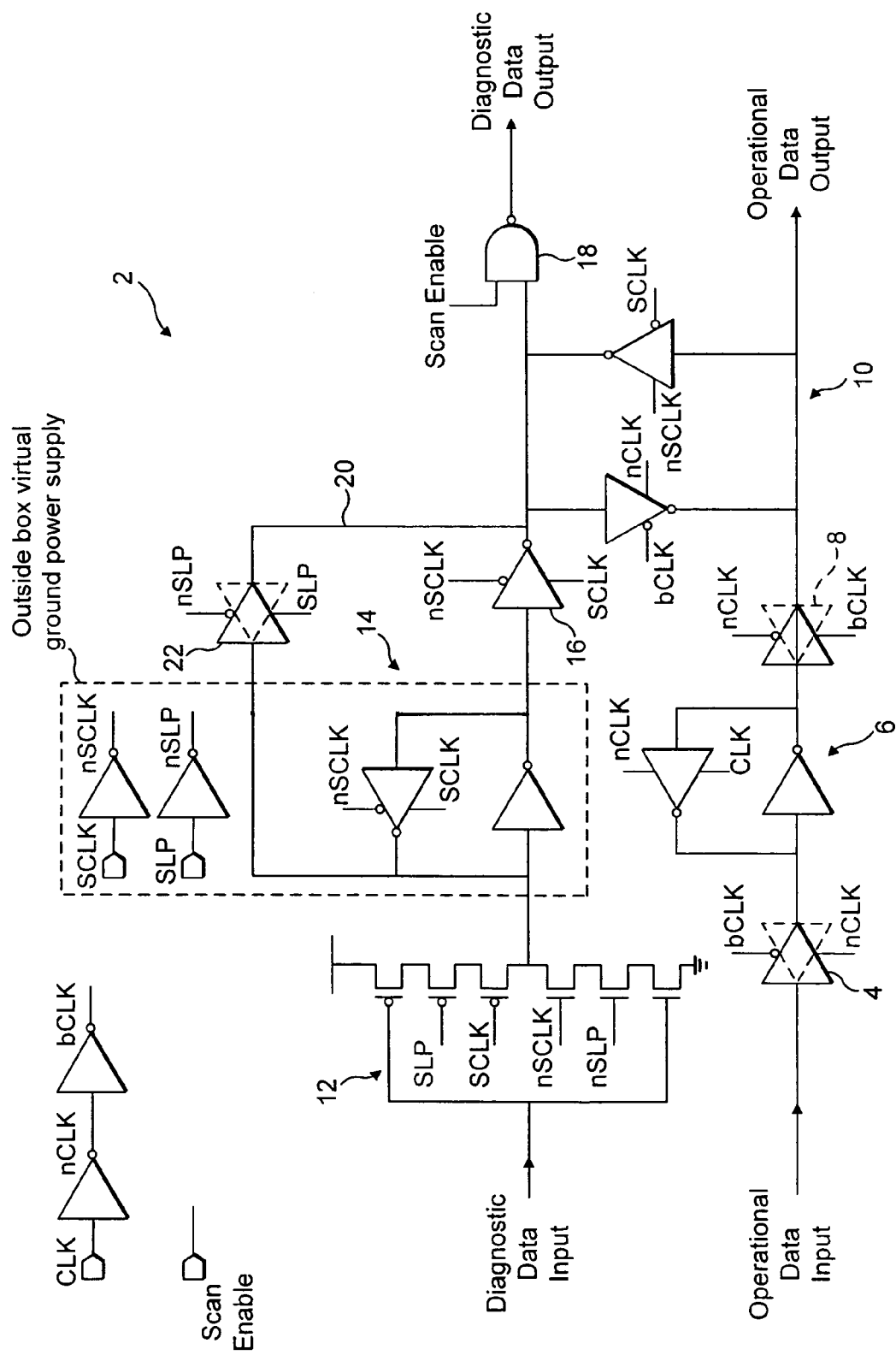
FIG. 1 schematically illustrates a circuit for storing a signal value that provides operational, diagnostic and sleep modes of operation.

FIG. 1 illustrates a circuit 2 for storing a signal value in operational, diagnostic and sleep modes. The circuit 2 includes an operational data path comprising a transmission gate 4, a operational data path master latch 6, a transmission gate 8 and a shared slave latch 10. (The transmission gates 8 may also be considered to form part of the latch.). A diagnostic data path is formed by a diagnostic path isolating circuit 12 (which is also a latch gate), a diagnostic data path master latch 14, a tristate inverter 16 (the tristate inverters discussed herein can in general be replace by any tristateable driver circuit if desired or appropriate), the shared slave latch 10 and a scan output enable gate 18. A sleep mode path 20 is provided from the shared slave latch 10 through a transmission gate 22 to the diagnostic data path master latch 14. The operational mode and diagnostic mode of the circuit 2 provides a clocked-scan type of flip-flop. More particularly, upon respective phases of an operational clock signal CLK, a signal value is clocked between the operational data path master latch 6 and the shared slave latch 10. Upon respective phases of a diagnostic clock signal SCLK a diagnostic signal value is clocked between the diagnostic data path master latch 14 and the shared slave latch 10. The diagnostic path output gate 18 serves to either block or allow the passing of diagnostic signal values between respective interconnected circuits 2 which are arranged as a serial scan chain (not illustrated) for diagnostic purposes.

The sleep mode path 20 acting under control of a sleep mode control signal SLP serves to couple an operational signal value held within the shared slave latch 10 into the diagnostic data path master latch 14 when it is desired to enter the sleep mode. The diagnostic clock signal SCLK can then be used to latch that operational signal value within the diagnostic data path master latch 14 during the sleep mode (a double latching arrangement during sleep mode would also be possible if enhanced soft error resistance was desired). It will be appreciated that the control signals needed to control the circuits described herein can be generated in a variety of different ways and desired or appropriate. The dotted box surrounding the diagnostic data path master latch 14 and the circuits providing the diagnostic clock signal SCLK and sleep mode control signal SLP indicates that these circuit elements remain powered during sleep mode (possibly with different power supply voltages; MCLK, SE and gate 30 should also remain powered during sleep mode) whereas those circuit elements outside of this box are powered down through the use of known techniques, such as virtual ground power supplies, virtual source power supplies or a combination of such techniques. In the context of FIG. 1, it will be seen that the sleep mode behaviour is supported by the diagnostic data path master latch 14. Accordingly the gates which form the diagnostic data path master latch 14 can be designed to reduce the power consumption during sleep mode. The performance of these gates in terms of speed and other criteria during diagnostic mode may be secondary to their low power consumption characteristics.

Figure 2:
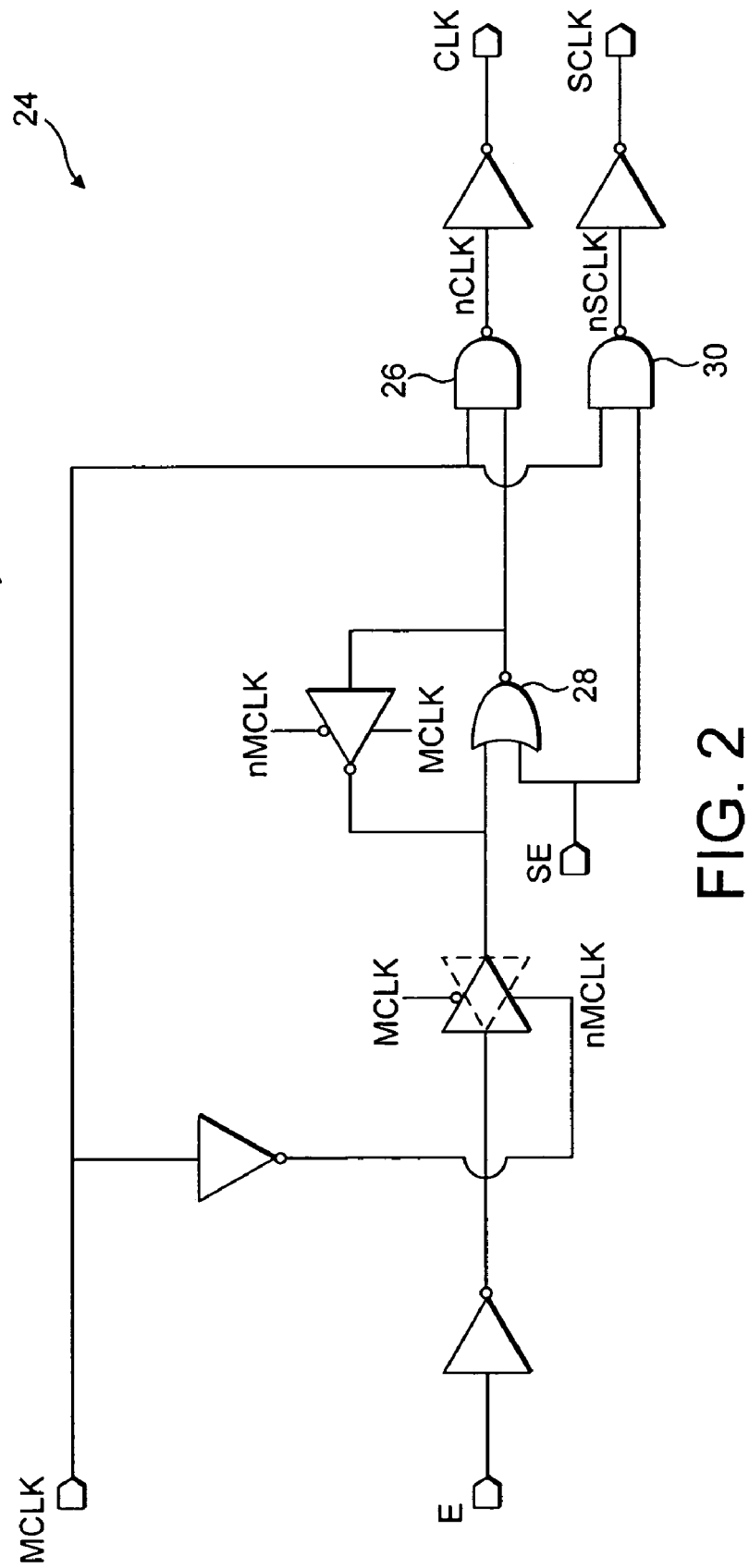
FIG. 2 schematically illustrates a clock signal generator circuit for use with the circuit of FIG. 1.

FIG. 2 illustrates a clock signal generator. This takes a master clock signal MCLK which is gated using a NAND gate 26 by a latched value of an enable signal E to form the operational clock signal CLK. The latching of the enable signal E under control of the master clock signal MCLK helps to avoid clock signal glitches which might otherwise be associated with changes in the enable signal E.

A scan enable signal SE acts to disable the operational clock signal CLK when it is asserted through the action of the NOR gate 28. It also serves to enable generation of the diagnostic clock signal SCLK following the master clock signal MCLK using NAND gate 30.

Figure 3:
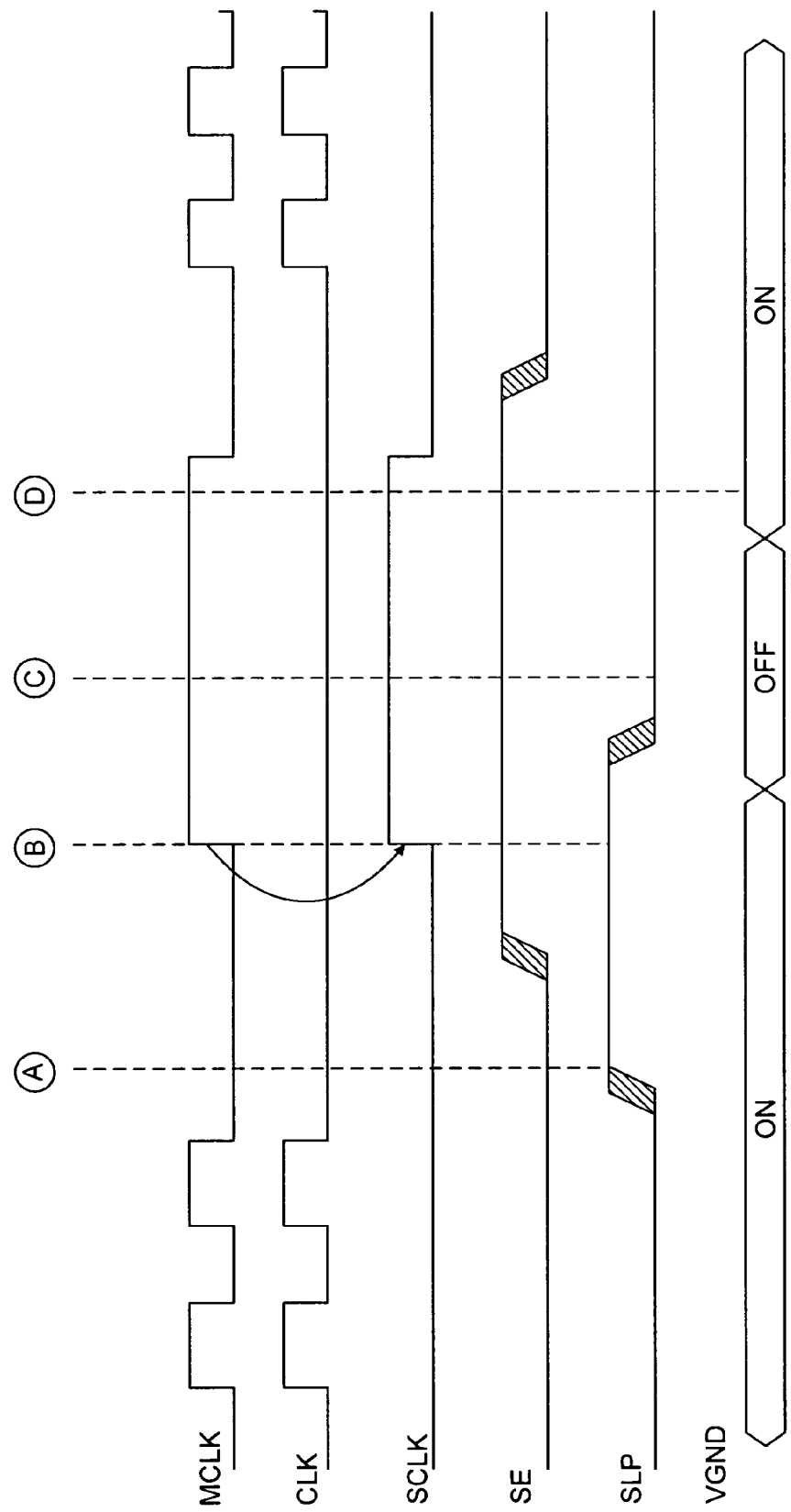
FIG. 3 is a signal timing diagram illustrating the entry and exit of the sleep mode for the circuit of FIG. 1.

FIG. 3 is a timing diagram illustrating the clock and control signals associated with the circuit of FIG. 1 when entering and leaving sleep mode. Various points in time A, B, C and D are marked in FIG. 3 and the state of the circuit of FIG. 1 at these different times is illustrated in respective ones of FIGS. 4 to 7.

Prior to entering the sleep mode the master clock MCLK is stopped low. This forces the operational clock CLK and the diagnostic clock SCLK to also be low. The sleep mode control signal SLP is then asserted. This sleep mode control signal SLP may be generated by a power controller circuit or under software control or in various other known ways.

Figure 4:
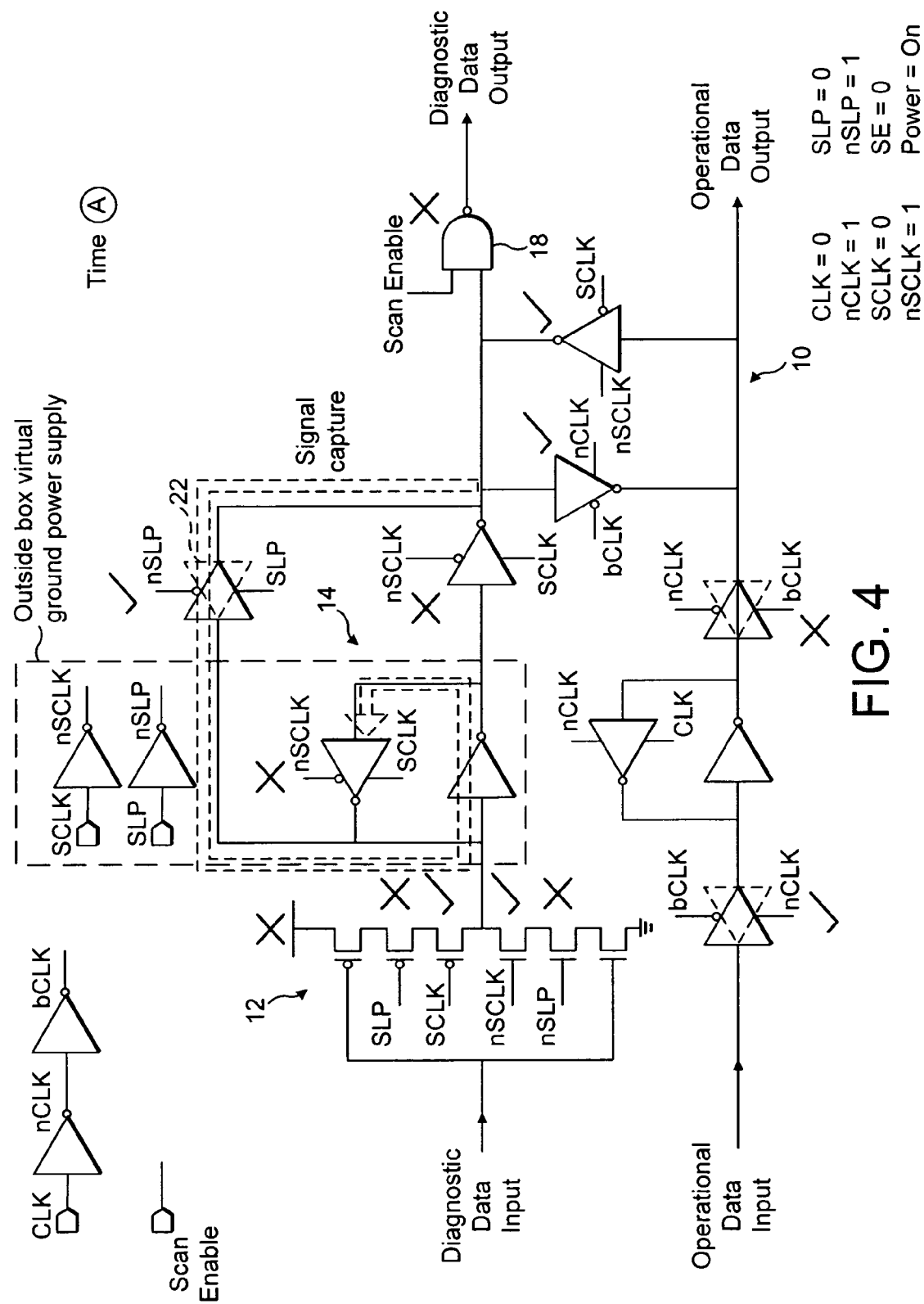
FIGS. 4 to 7 illustrate the state and operation of the circuit of FIG. 1 at various times illustrated in the timing diagram of FIG. 3.

The sleep mode control signal SLP serves to open the transmission gate 22 as is illustrated in FIG. 4, which corresponds to time A. This allows capture of the operational signal value which is held within the shared slave latch 10 into the diagnostic data path master latch 14. The assertion of the sleep mode control signal SLP also serves to cause the diagnostic data path isolating circuit 12 to block diagnostic data inputs into the diagnostic data path from reaching the diagnostic data path master latch 14 and so corrupting the operational signal value being stored therein.

Subsequent to time A the scan enable signal is asserted. As explained in the context of FIG. 2 this serves to enable generation of the diagnostic clock signal SCLK following the master clock signal MCLK whilst simultaneously disabling the operational clock signal CLK. Thus, as illustrated in FIG. 3 at time B when the master clock signal MCLK rises the diagnostic clock signal SCLK also rises whilst the operational clock signal CLK remains low.

Figure 5:
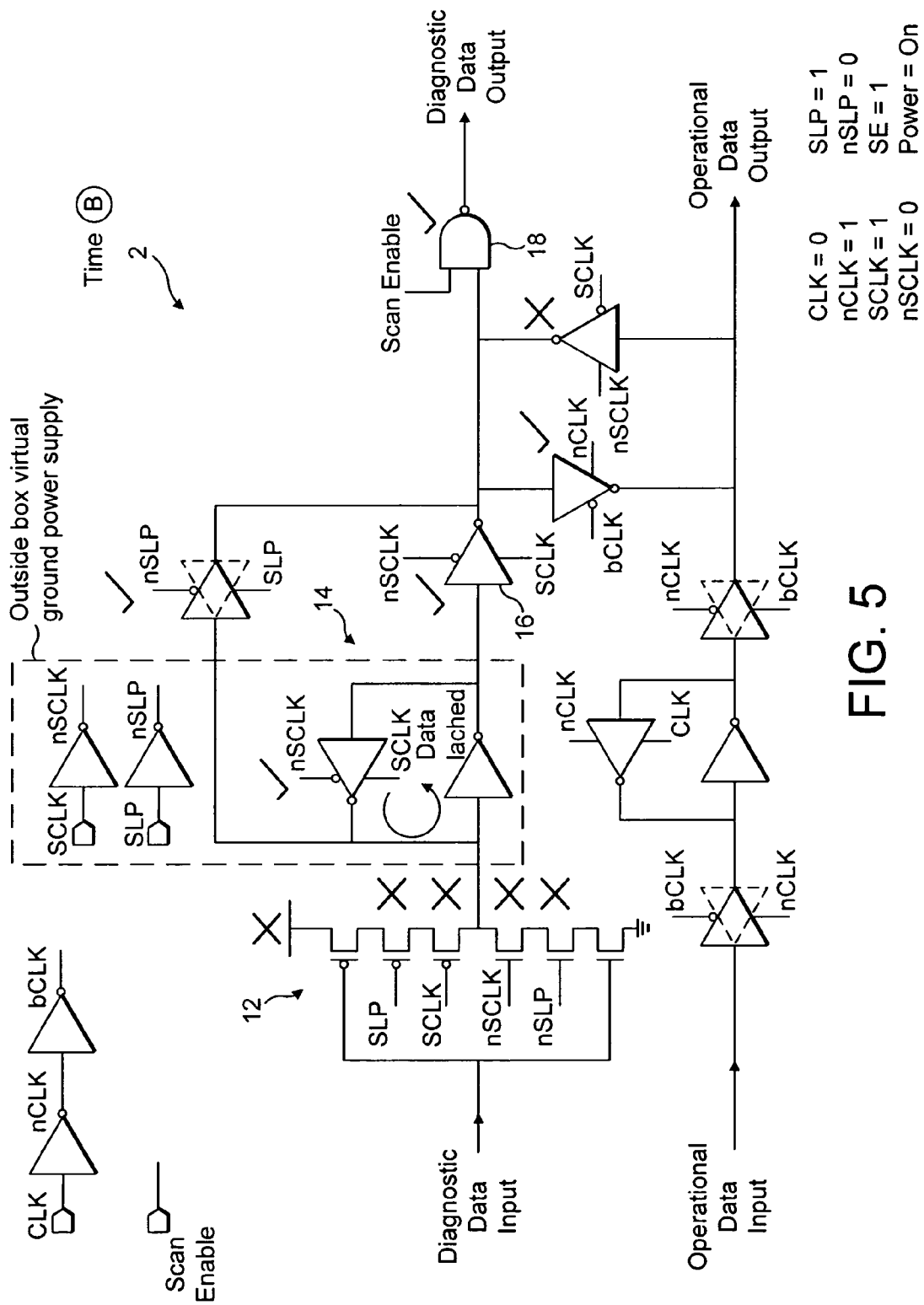
Figure 6:
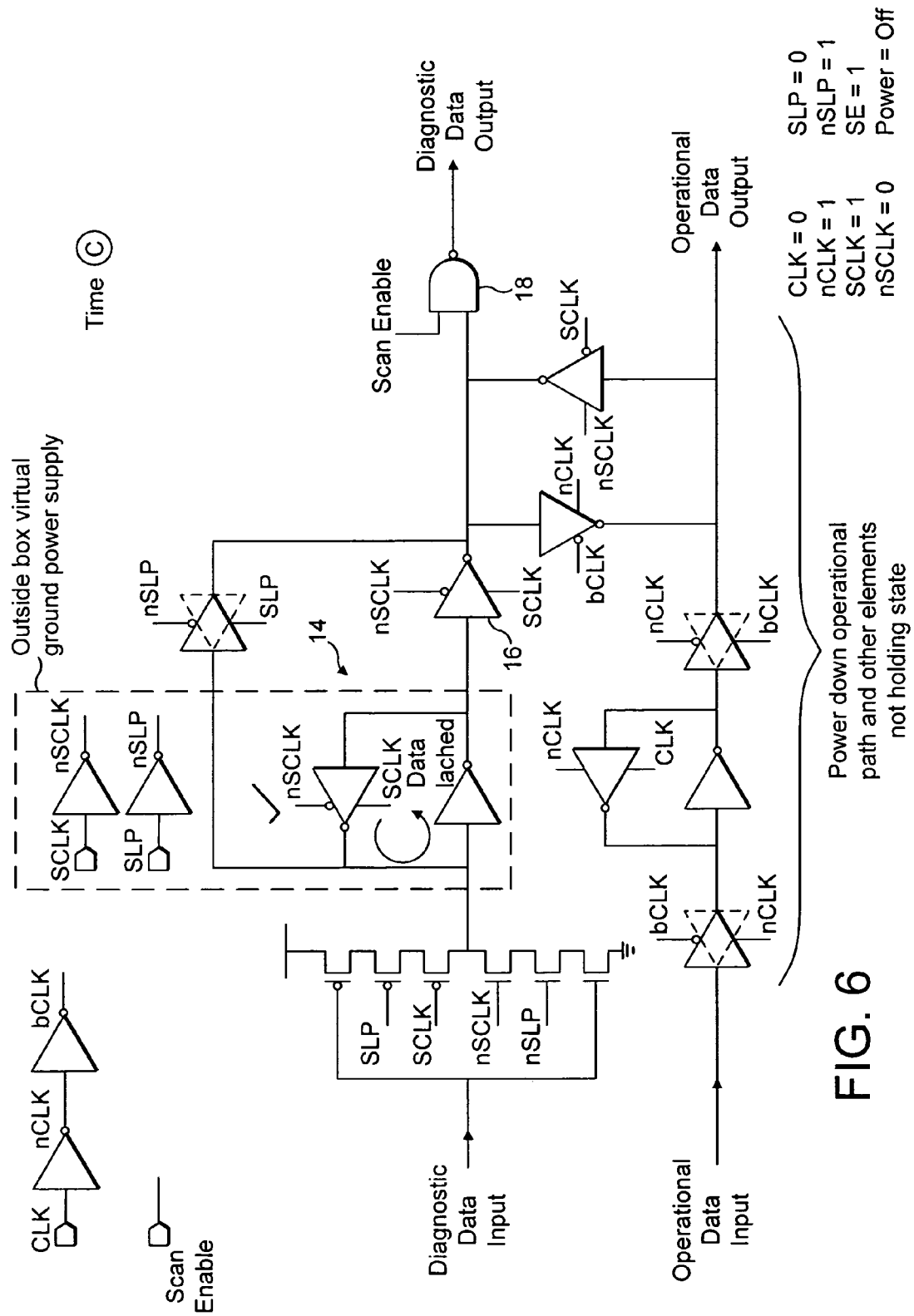
Figure 7:
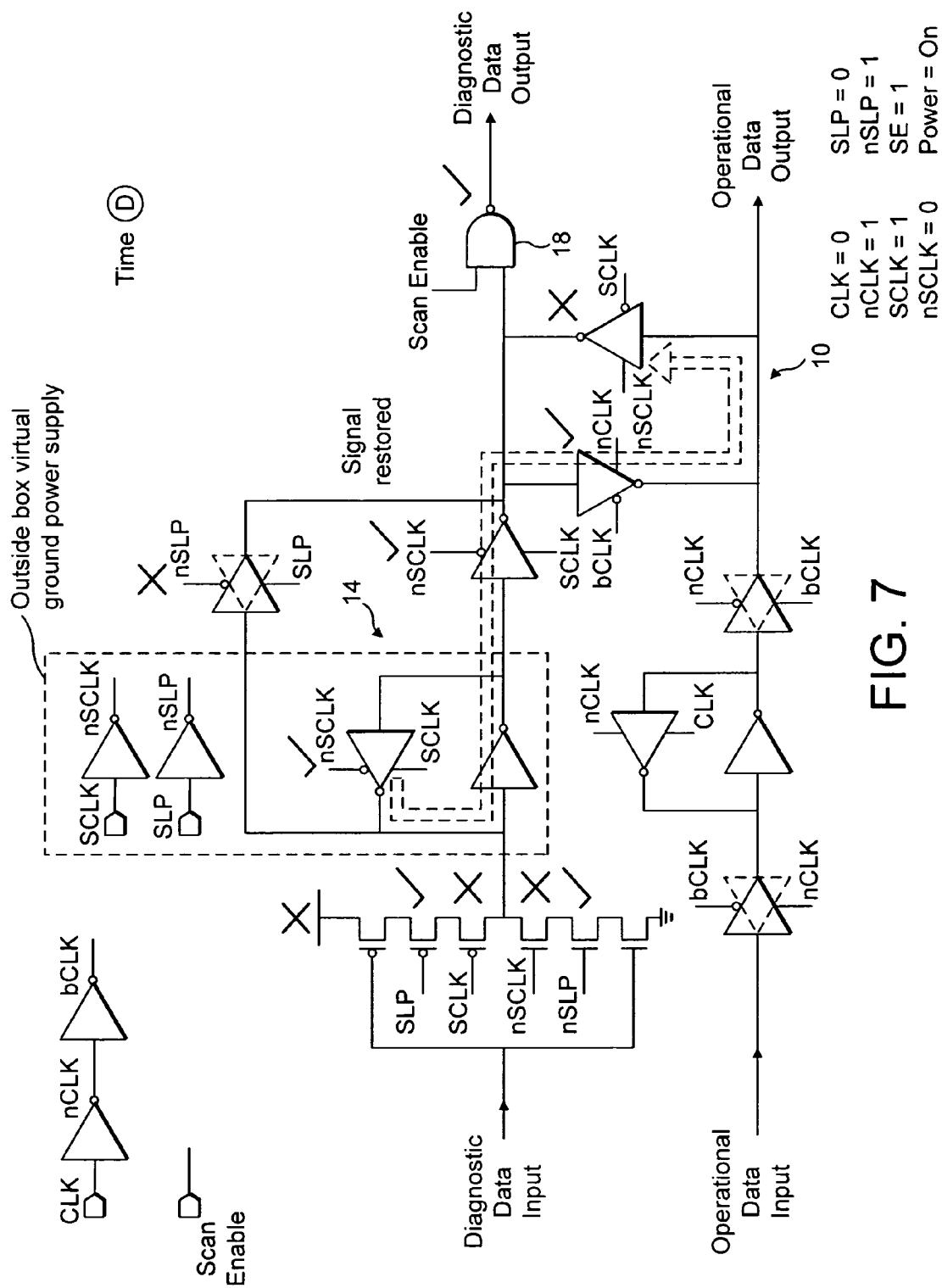

FIG. 5 illustrates the response of the circuit 2 to the applied control signals at time B. In particular the operational signal value is now latched by the feedback within the diagnostic data path master latch 14. The tristate inverter 16 is also now driving as is the diagnostic data output gate 18 (which is always driving when powered) allowing the stored value within the diagnostic data path master latch 14 to propagate to the diagnostic data output. However, since the diagnostic data path isolating circuit 12 is still serving to block diagnostic data inputs, the diagnostic data output from the diagnostic data path will not corrupt other stored operational signal values held in serially connected further circuits 2.

Following time B, the sleep mode control signal SLP is transitioned low and the power supply is removed from all those circuit elements outside of the illustrated dotted line box. All these circuit elements can then float or adopt some other value depending upon their particular circumstances whilst the operational data value that is held in the diagnostic data path master latch 14. This is the state of the circuit at time C illustrated in FIG. 6.

In order to exit the sleep mode all that is required is to restore the power supply with appropriate control signals in place. The tristate inverter 16 is open by virtue of the high level of the diagnostic data clocks CLK allowing a path for the stored operational signal value out from the diagnostic data path master latch 14 back to the shared slave latch 10. As illustrated in FIG. 3, subsequent to time D illustrated in FIG. 7, the nCLK signal can be taken low followed by the scan enable signal SE being taken low thereby allowing the clock generator circuit 24 of FIG. 2 to commence generation of the operational clock signal CLK in response to clocking of the master clock signal MCLK. Normal operational mode functionality can then resume. It should be noted that the correct value being placed in the shared latch slave latch will cause all downstream circuits to correctly evaluate upon the first rising edge of CLK.

It will be seen that in the operation of the circuit 2, a diagnostic mode clock signal SCLK is provided and a fixed relationship between this and the operational mode clock signal CLK is required such that the diagnostic clock signal SCLK is inactive during the operational mode and visa versa. This allows the two tristate inverters within the shared slave latch 10 to operate to provide appropriately clocked latching functionality as part of both the operational data path and the diagnostic data path.

Figure 8:
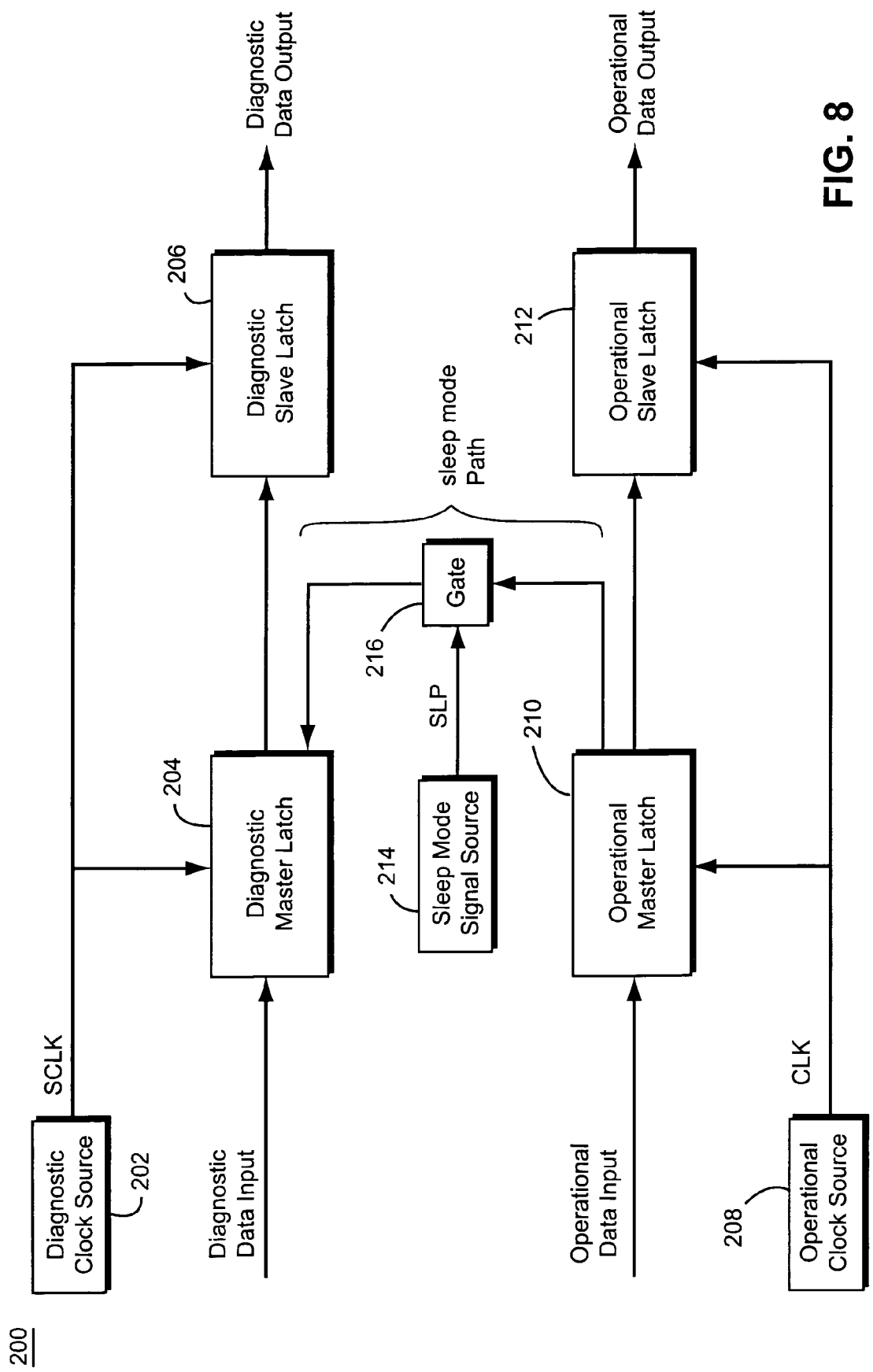
FIG. 8 is a function block diagram that provides operational, diagnostic and sleep modes of operation.

FIG. 8 is a function block diagram that illustrates another non-limiting embodiment directed to a four latch circuit 200 for storing a value, where the circuit has to operational, diagnostic, and sleep modes. An operational data path comprises an operational data path master latch 210 and an operational slave latch 212. A diagnostic data path is formed by a diagnostic data path master latch 204 and a diagnostic data path master latch 206. A sleep mode path is provided from the operational master latch through a transmission gate 216 to the diagnostic data path master latch 204. The operational mode and diagnostic mode of the circuit 200 provides a clocked-scan type of flip-flop. More particularly, upon respective phases of an operational clock signal CLK provided by an operational clock source 208, a signal value is clocked between the operational data path master latch 6 and the operational slave latch 212. Upon respective phases of a diagnostic clock signal SCLK provided by a diagnostic clock source 202, a diagnostic signal value is clocked between the diagnostic data path master latch 204 and diagnostic slave latch 206. The gate 216 is controlled by a sleep signal SLP generated by a sleep mode signal source 214 during the sleep mode to pass the operational master latch data over the sleep mode path for storage in the diagnostic master latch 204.

Although FIG. 8 shows that the operational master latch data value is stored via a sleep mode path in the diagnostic master latch, the sleep mode path can be configured to allow transfer of the operational signal value between one of the operational data path master latch 210 or the operational data path slave latch 212 and one of the diagnostic data path master latch 204 or the diagnostic data path slave latch 206.

In any event, the diagnostic data path serves to store said operational signal value in one of the diagnostic path latches while the operational path is powered down during the sleep mode.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A circuit for storing a signal value, said circuit comprising:
    an operational clock signal source operable in an operational mode to provide an operational clock signal;
    an operational data path operable to store an operational signal value and including:
        an operational data path master latch clocked by said operational clock signal; and
        an operational data path slave latch clocked by said operational clock signal;
    a diagnostic clock signal source operable in a diagnostic mode to provide a diagnostic clock signal;
    a diagnostic data path operable to store a diagnostic signal value and including:
        a diagnostic data path master latch clocked by said diagnostic clock signal; and
        a diagnostic data path slave latch clocked by said diagnostic clock signal;
    a sleep mode control signal source operable to provide a sleep mode control signal;
    a sleep mode path selectively connected under control of said sleep mode control signal to allow transfer of said operational signal value between one of said operational data path master latch or said operational data path slave latch and one of said diagnostic data path master latch or said diagnostic data path slave latch, whereby said diagnostic data path serves to store said operational signal value whilst said operational path is powered down during said sleep mode,
    wherein a fastest signal path through said operational data path is a primary path and said sleep mode path connects to a point in said operational data path which is decoupled from said primary path.

2. A circuit as claimed in claim 1, wherein said diagnostic data path is part of a serial scan chain for serially scanning diagnostic data through an integrated circuit.

3. A circuit as claimed in claim 1, wherein said sleep mode path includes a transmission gate switched by said sleep mode control signal.

4. A circuit as claimed in claim 1, wherein said sleep mode control signal triggers transfer of said operational signal into said diagnostic data path and said diagnostic clock signal controls latching of said operational signal within said diagnostic data path.

5. A circuit as claimed in claim 1, wherein powering up said operational data path following said sleep mode with appropriate control signals in place triggers transfer of said operational value back into said operational data path.

6. A circuit as claimed in claim 1, comprising a diagnostic path isolating circuit coupled to an input of said diagnostic data path and controlled by said sleep mode control signal to isolate said diagnostic data path from other circuits for storing a signal value during sleep mode operation.

7. A method of storing a signal value, said method comprising the steps of:
    in an operational mode providing an operational clock signal;
    storing an operational signal value within an operational data path master latch and an operational data path slave latch clocked by said operational clock signal;
    in a diagnostic mode providing a diagnostic clock signal;
    storing a diagnostic signal value within a diagnostic data path master latch and a diagnostic data path slave latch clocked by said diagnostic clock signal;
    providing a sleep mode control signal; and
    selectively connecting a sleep mode path under control of said sleep mode control signal to allow transfer of said operational signal value between one of said operational data path master latch or said operational data path slave latch and one of said diagnostic data path master latch or said diagnostic data path slave latch, whereby said diagnostic data path serves to store said operational signal value whilst said operational path master latch and said operational path slave latch are powered down during said sleep mode,
    wherein a fastest signal path through said operational data path is a primary path and said sleep mode path connects to a point in said operational data path which is decoupled from said primary path.

8. A method as claimed in claim 7, wherein said diagnostic data path master latch and said diagnostic data path slave latch are part of a serial scan chain for serially scanning diagnostic data through an integrated circuit.

9. A method as claimed in claim 7, wherein said sleep mode path includes a tristateable driver circuit switched by said sleep mode control signal.

10. A method as claimed in claim 7, wherein said sleep mode control signal triggers transfer of said operational signal into said one of said diagnostic data path master latch and said diagnostic data path slave latch and said diagnostic clock signal controls latching of said operational signal within said one of said diagnostic data path master latch and said diagnostic data path slave latch.

11. A method as claimed in claim 7, wherein powering up said operational data path master latch and said operational data path slave latch following said sleep mode with appropriate control signals in place triggers transfer of said operational value back into said one of said operational data path master latch and said operational data path slave latch.

12. A method as claimed in claim 7, wherein a diagnostic path isolating circuit coupled to an input of said diagnostic data path and controlled by said sleep mode control signal serves to isolate said diagnostic data path from other circuits for storing a signal value during sleep mode operation.

13. A circuit for storing a signal value, said circuit comprising:
    an operational clock signal source operable in an operational mode to provide an operational clock signal;
    an operational data path operable to store an operational signal value and including:
        one of an operational data path master latch and an operational data path slave latch being clocked by said operational clock signal; and
        a shared latch functioning as the other of the operational data path master latch and the operational data path slave latch in the operational mode, said shared latch being clocked by said operational clock signal in the operational mode;
    a diagnostic clock signal source operable in a diagnostic mode to provide a diagnostic clock signal;
    a diagnostic data path operable to store a diagnostic signal value and including:

one of a diagnostic data path master latch and a diagnostic data path slave latch being clocked by said diagnostic clock signal; and the shared latch functioning as the other of the diagnostic data path master latch and the diagnostic data path slave latch in the diagnostic mode, said shared latch being clocked by said diagnostic clock signal in the diagnostic mode;

a sleep mode control signal source operable to provide a sleep mode control signal;

a sleep mode path selectively connected under control of said sleep mode control signal to allow transfer of said operational signal value between the one operational data path latch or said shared latch functioning as the other operational data path latch and the one diagnostic data path latch or said shared latch functioning as the other diagnostic data path latch, whereby said diagnostic data path serves to store said operational signal value whilst said operational path is powered down during said sleep mode, wherein a fastest signal path through said operational data path is a primary path and said sleep mode path connects to a point in said operational data path which is decoupled from said primary path.

14. A circuit as claimed in claim 13, wherein during said sleep mode, said operational signal is held within said diagnostic data path in the one diagnostic data path latch so that said shared latch may be powered down during said sleep mode.

15. A circuit as claimed in claim 13, wherein said shared latch receives said operational signal value from said operational data path master latch.

16. A circuit as claimed in claim 13, wherein said operational data path slave latch receives said operational signal value from said shared latch.

17. A circuit as claimed in claim 13, wherein said shared latch receives said diagnostic signal value from said diagnostic data path master latch.

18. A circuit as claimed in claim 13, wherein said diagnostic data path slave latch receives said diagnostic signal value from said shared latch.

19. A circuit as claimed in claim 13, wherein said shared latch comprises a first tristate driver selectively enabled by said operational clock signal and a second tristate driver selectively enabled by said diagnostic clock signal.

20. A method of storing a signal value, said method comprising the steps of:

in an operational mode, providing an operational clock signal;

storing an operational signal value within one of an operational data path master latch and an operational data path slave latch and a shared latch functioning as the other of the operational data path master latch and the operational data path slave latch, the one operational data path latch being clocked by said operational clock signal and the shared latch being clocked by said operational clock signal in the operational mode;

in a diagnostic mode providing a diagnostic clock signal;

storing a diagnostic signal value within the one diagnostic data path latch a diagnostic data path slave latch and a shared latch functioning as the other of the diagnostic data path master latch and the diagnostic data path slave latch, the one diagnostic path latch being clocked by said diagnostic clock signal and the shared latch being clocked by said diagnostic clock signal in the diagnostic mode;

providing a sleep mode control signal; and selectively connecting a sleep mode path under control of said sleep mode control signal to allow transfer of said operational signal value between the one operational data path latch or said shared latch functioning as the other operational data path latch and the one diagnostic data path latch or said shared latch functioning as the other diagnostic data path latch, whereby said diagnostic data path serves to store said operational signal value whilst said operational path master latch and said operational path slave latch are powered down during said sleep mode, wherein a fastest signal path through said operational data path is a primary path and said sleep mode path connects to a point in said operational data path which is decoupled from said primary path.

21. A method as claimed in claim 20, wherein during said sleep mode said operational signal is held within the one diagnostic data path latch so that said shared latch may be powered down during said sleep mode.

22. A method as claimed in claim 20, wherein said shared latch receives said operational signal value from said operational data path master latch.

23. A method as claimed in claim 20, wherein said operational data path slave latch receives said operational signal value from said shared latch.

24. A method as claimed in claim 20, wherein said shared latch receives said diagnostic signal value from said diagnostic data path master latch.

25. A method as claimed in claim 20, wherein said diagnostic data path slave latch receives said diagnostic signal value from said shared latch.

26. A method as claimed in claim 20, wherein said shared latch comprises a first tristate driver selectively enabled by said operational clock signal and a second tristate driver selectively enabled by said diagnostic clock signal.

* * * * *